United States Patent
Perner (10) Patent No.: US 7,268,622 B2
(45) Date of Patent: Sep. 11, 2007

(54) ANALOG PREAMPLIFIER CALIBRATION (75) Inventor: Frederick A. Perner, Santa Barbara, CA (US)

(73) Assignee: Samsung Electronics Co., Ltd. (KR)

( * ) Notice: Subject to any disclaimer, the term of this patent is extended or adjusted under 35 U.S.C. 154(b) by 135 days.

(21) Appl. No.: 11/266,861

(22) Filed: Nov. 3, 2005

(65) Prior Publication Data
US 2007/0096815 A1   May 3, 2007

(51) Int. Cl.
H03F 3/45 (2006.01)
(52) U.S. Cl. .......................... 330/253; 330/9
(58) Field of Classification Search .......... 330/2, 330/9, 253, 257; 327/124, 307
See application file for complete search history.

(56) References Cited

U.S. PATENT DOCUMENTS 6,262,625 B1 * 7/2001 Perner et al. .................. 330/2
6,586,989 B2 * 7/2003 Perner et al. .................. 330/9
6,873,209 B2 * 3/2005 Takata et al. ................ 330/253

* cited by examiner

Primary Examiner—Henry Choe
(74) Attorney, Agent, or Firm—Myers Bigel Sibley & Sajovec PA (57) ABSTRACT

A combined analog and digital calibration circuit and method for adjusting an output offset voltage of a differential amplifier circuit are provided. The circuit comprises a digitally controlled voltage divider positioned between at least one isolated well and a controllable voltage source, a controllable voltage source controlled by an initial constant current and a variable current, and a controller to modify the variable current to continuously adjust the back gate control voltage. The method comprises adjusting a control voltage of at least one of a pair of input transistors using a back gate control voltage, providing an analog current to establish a back gate control voltage, and altering the analog current when the back gate control voltage causes an output offset voltage to differ from a reference voltage by more than a predetermined quantity.

21 Claims, 8 Drawing Sheets

ANALOG PREAMPLIFIER CALIBRATION

BACKGROUND OF THE INVENTION

1. Field of the Invention

The present invention relates generally to the field of electronic circuitry, and more particularly to relatively precise calibration of an analog preamplifier.

2. Description of the Related Art

Relatively precise calibration of analog devices can be highly challenging, particularly in advanced applications wherein analog device calibration errors can significantly affect overall performance or, in certain cases, damage the device or fail. For example, magnetic random access memory (MRAM) circuits can require precision calibration of analog circuits contained therein.

Changes in circuit environmental parameters, most notably temperature and supply voltages, have previously been sensed using circuits having digital outputs to either flags warning of system environmental changes and a need to recalibrate, or the digital outputs directly change the state of the calibration registers.

Figure 1:
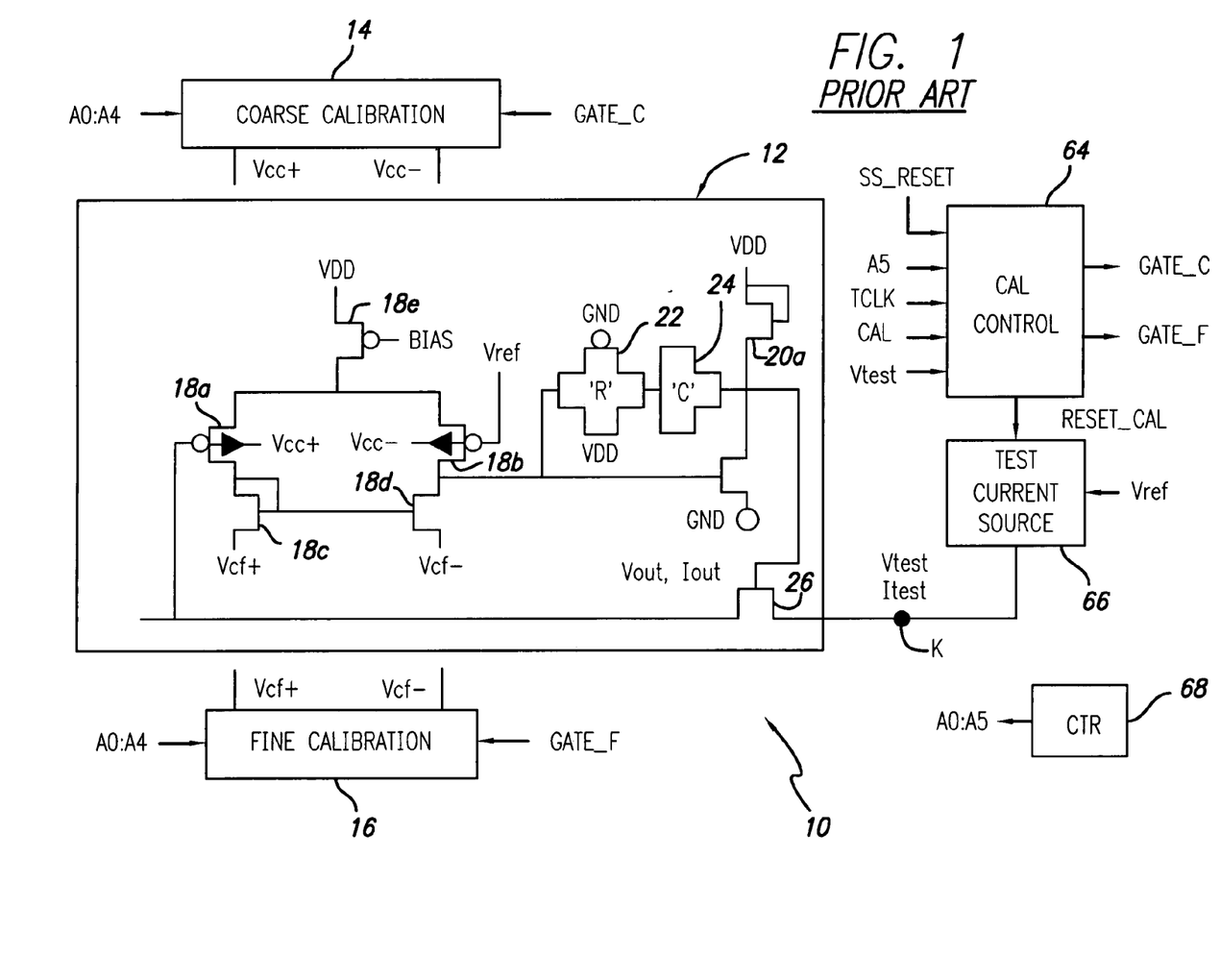
FIG. 1 is a direct injection charge amplifier having digital offset calibration using coarse and fine adjustment circuitry.
Figure 2:
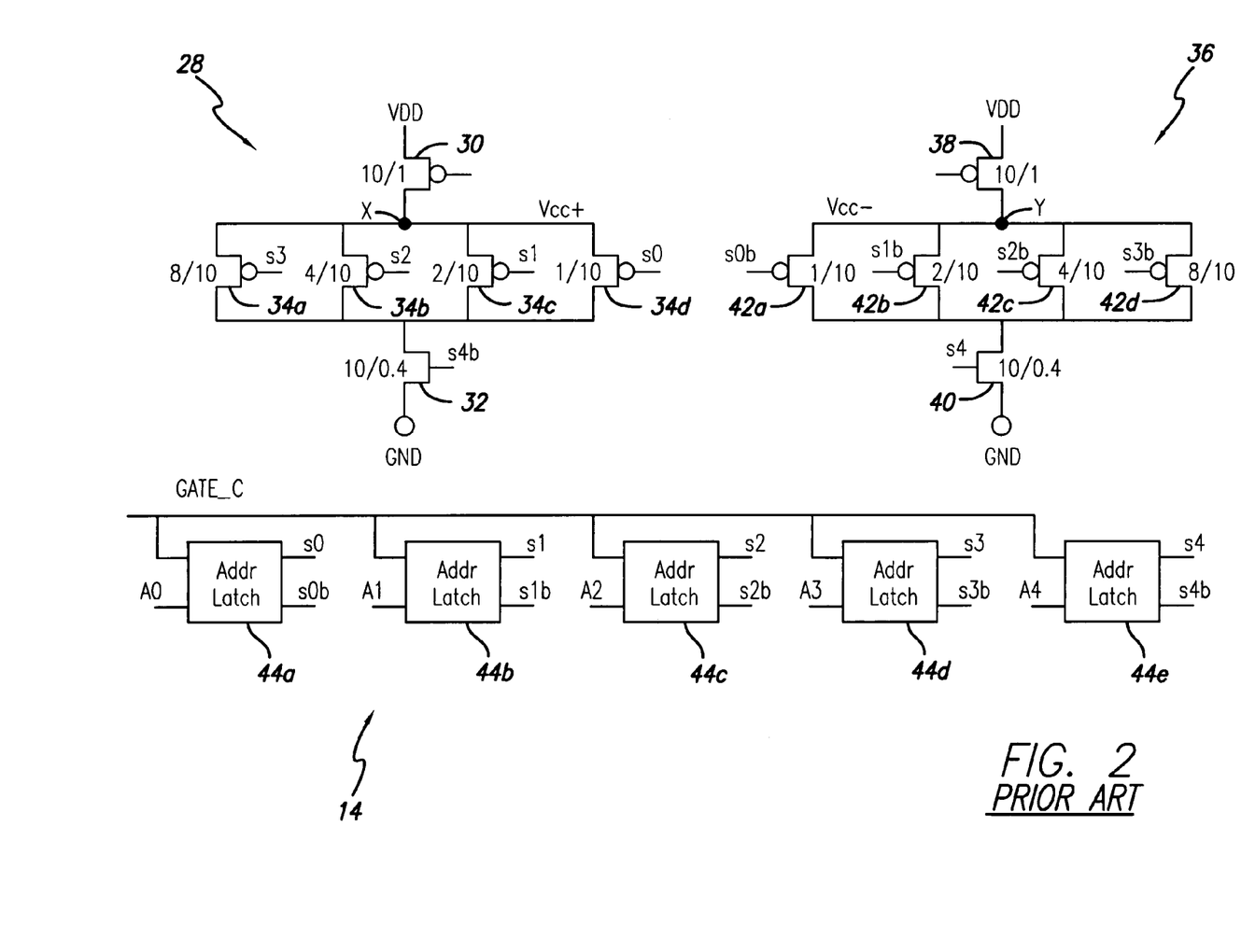
FIG. 2 illustrates coarse and fine adjustment circuitry according to the design of FIG. 1.

Previous attempts to provide precision analog calibration include, for example, providing a coarse calibration function for offset compensation using a digitally controlled, resistor voltage divider array and a static switchable current source in place of an adjustable current source. Such a device is illustrated in FIG. 1, where FIG. 1 is taken from U.S. Pat. No. 6,262,625 to Pemer et al. assigned to Hewlett Packard Company, the assignee of the present invention. The '625 patent is hereby incorporated by reference, particularly for an extensive description of the components and operation of shown in FIG. 1. The circuit of FIG. 1 performs a basic coarse calibration function in discrete large calibration steps. Coarse calibration circuit 14 performs coarse correction by applying a back gate voltage bias $V_{cc+}$ and $V_{cc-}$ to the isolated wells of the first and second PMOS transistors 18a and 18b. Certain fine calibration adjustments are also provided. FIG. 2, also taken from the '625 patent, illustrates the details of coarse calibration circuit 14, where the coarse calibration circuit 14 includes a pair of programmable voltage dividers 28 and 36 for developing back gate voltages $V_{cc+}$ and $V_{cc-}$, and each voltage divider 28 and 36 is connected between a source of operating potential, VDD, and a reference potential GND.

Simple coarse/fine correction can be inefficient, ineffective, and time consuming and can be unworkable in certain applications. Generally, these coarse/fine corrections can degrade overall performance, particularly when recalibration is required. Thus solutions have been proposed that include providing for finer calibration step, such as coarse, fine, and extra fine calibration steps. Such a varied calibration step design can more efficiently control the back gate bias of an array of transistors comprising a CMOS differential pair of transistors. Such a design improves offset control by providing for more exact calibration steps, but still only enables discrete digital steps to control the state of the control registers, again not highly efficient.

A further improvement over existing calibration solutions in this environment provides for UP/DOWN control of registers storing the state of the back gate control information. Within narrow control limits, such a design reduces the overall time for calibration and/or recalibration by stepping the state of the calibration control registers one minimum step at a time. In cases where radical changes in calibration state are required, such as outside a desired range, control of the calibration registers can take a significant amount of time. Further, if wide swings occur in short periods of time, the UP/DOWN control method cannot acquire the required state quickly enough. An additional design provides for a diode element across the back gate divider circuits to address the issue of VDD sensitivity. Such a construction places a voltage control element in the back gate bias network. The power source is similar to the static switchable current source provided in the '625 patent. One additional design provides an analog control circuit to adjust an internal node of the CMOS amplifier to control offset changes. Such a circuit can be difficult to implement relative to the back gate bias control circuit.

These prior solutions consider primarily digital control of a set of registers controlling the back gate bias of the CMOS differential pair transistors. These solutions require time performing recalibration and can only control the calibration in discrete steps, which is inefficient and/or imprecise in many instances.

It would be advantageous to provide a digitally controlled calibration circuitry that can quickly and efficiently control states of independent circuits employed in advanced applications, such as MRAM, where the circuitry tends to result in generally improved performance over previous designs.

SUMMARY OF THE INVENTION

According to a first aspect of the present design, there is provided a combined analog and digital calibration circuit for controlling an output offset voltage of a differential amplifier circuit using a back gate control voltage provided to at least one isolated well. The circuit comprises a digitally controlled voltage divider positioned between at least one isolated well and a controllable voltage source, a controllable voltage source controlled by an initial constant current and a variable current, and a controller to modify the variable current to continuously adjust the back gate control voltage.

According to a second aspect of the present design, there is provided a method for adjusting an output offset voltage of a differential amplifier circuit. The method comprises adjusting a control voltage of at least one of a pair of input transistors using a back gate control voltage, providing an analog current to establish a back gate control voltage, and altering the analog current when the back gate control voltage causes an output offset voltage to differ from a reference voltage by more than a predetermined quantity. Altering the analog current changes the back gate control voltage to minimize a difference between output offset voltage and the reference voltage.

These and other objects and advantages of all aspects of the present invention will become apparent to those skilled in the art after having read the following detailed disclosure of the preferred embodiments illustrated in the following drawings.

DESCRIPTION OF THE DRAWINGS

The present invention is illustrated by way of example, and not by way of limitation, in the figures of the accompanying drawings in which.

DETAILED DESCRIPTION OF THE INVENTION

The present invention employs analog calibration within the differential amplifier circuitry to more effectively and efficiently control calibration. The present design incorporates an adjustable current source to a back gate bias circuit comprising a voltage divider across a diode element, such as a PN junction diode or a BJT (bipolar junction transistor) or a MOST (Metal Oxide Semiconductor Transistor).

As noted, one previous design provides offset calibration using coarse calibration and fine calibration digital circuitry. From FIG. 1, circuit 10 includes a direct injection charge amplifier 12, a coarse calibration circuit 14 and a fine calibration circuit 16 formed on a substrate. The charge amplifier 12 includes a PMOS differential amplifier. First, second and third PMOS transistors 18a, 18b and 18e and first and second NMOS transistors 18c and 18d of the differential amplifier provide a controlled current path. The substrate is common to the NMOS transistors 18c and 18d. However, the PMOS transistors 18a and 18b are in isolated N-type wells in the substrate. A PMOS transistor in an isolated well in a substrate may be formed by two P-type diffusions bridged by an oxide barrier and covered by a gate electrode. An N-type diffusion in the well is used as a contact to the well. These N-type diffusions allow the back gate bias enable control of the first and second PMOS transistors 18a and 18b. Arrows extending through gates of the PMOS transistors 18a and 18b schematically represent connections to the back gates.

The differential amplifier is followed by a second stage amplifier circuit including two transistors 20a and 20b for boosting the gain so that the output can be controlled to a desired value when the feedback loop is closed. The feedback loop includes the first PMOS transistor 18a, followed by the second stage operational amplifier circuit 20a and 20b and a current source transistor 26. The feedback signal is the output voltage Vout and the loop is closed when the output voltage Vout is applied to the gate of the first PMOS transistor 18a.

As a consequence of working with a high gain amplifier, closed loop stability becomes an issue. Frequency compensation components (a resistor-capacitor compensation circuit 22, 24) controls the stability of the second stage operational amplifier circuit by reducing high frequency gain of the second stage amplifier circuit and thereby preventing the closed loop operational amplifier from going unstable.

The direct injection charge amplifier 12 further includes the current source transistor 26, which has a gate coupled to an output of the R-C circuit 22/24 and a drain-source path coupled to an input of the differential amplifier. In the normal operation mode, the circuit 10 senses and controls the output voltage Vout to a prescribed value by adjusting the current in the current source transistor 26 and then holding the current in the current source transistor 26 constant during a period of time.

The coarse calibration circuit 14 performs coarse offset correction during a normal mode of operation. The coarse calibration circuit 14 performs the coarse correction by applying a back gate bias voltage Vcc+ and Vcc– to the isolated wells of the first and second PMOS transistors 18a and 18b. The level of the back gate bias voltage Vcc+ and Vcc– is set according to a first digital number stored in the coarse calibration circuit 14. The fine calibration circuit 16 performs fine offset correction during the normal mode of operation. The fine correction is performed by adjusting impedance of the transistors 18a, 18b, 18c, 18d and 18e in the differential amplifier. The amount of the impedance adjustment is determined by a second digital number stored in the fine calibration circuit 16.

Figure 3:
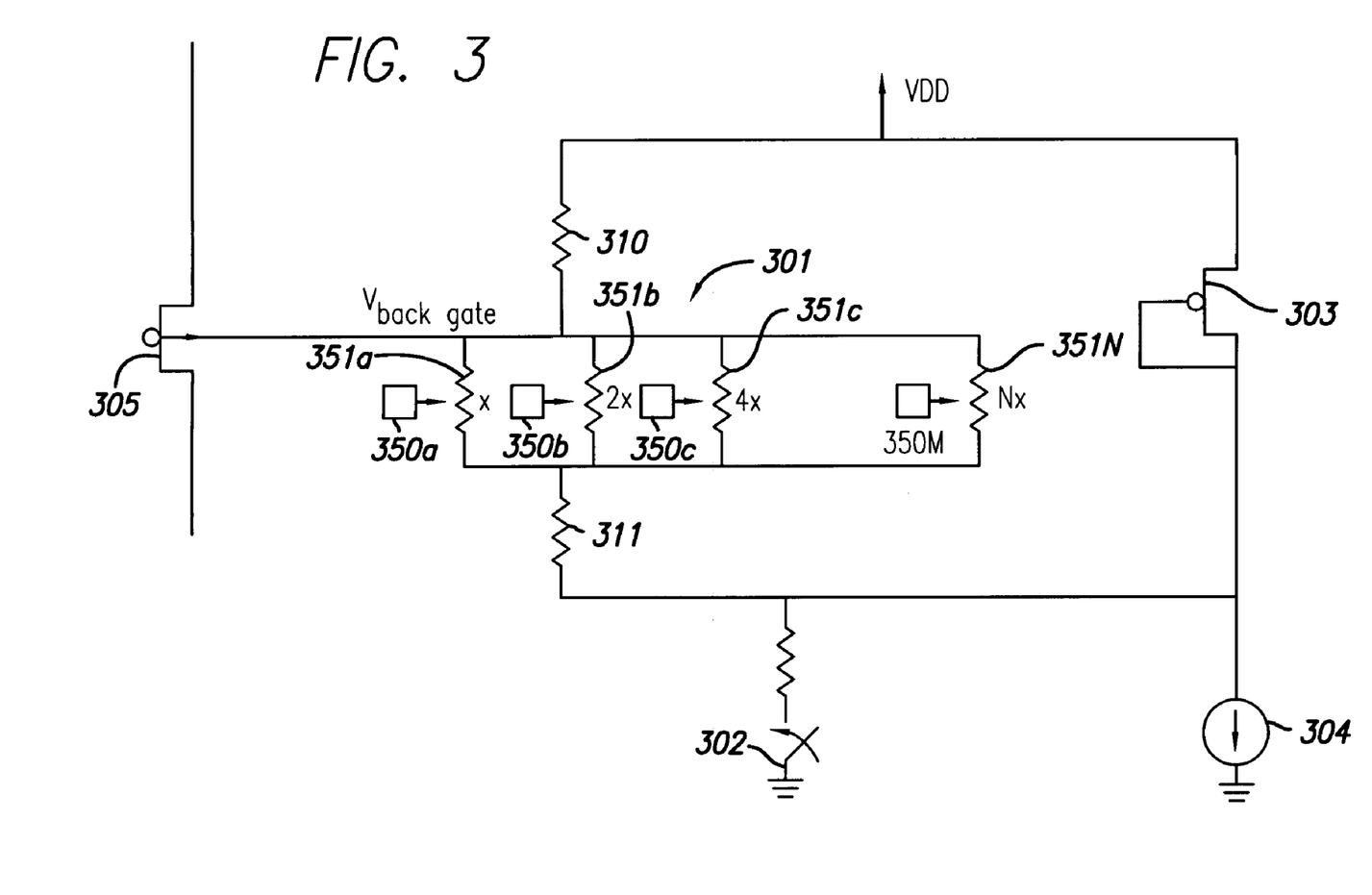
FIG. 3 shows the general components of the combined digital and analog calibration circuit of the present design.

The present design complements the foregoing by combining digital and analog calibration functionality into a single circuit. FIG. 3 illustrates the general components of the circuit of the present design. From FIG. 3, back gate voltage is developed by voltage divider 301. As with the preceding design, the voltage divider 301 is connected to VDD and a switch 302 provides a connection to ground. A diode voltage reference 303 is also provided. The current design provides for an analog control element 304 for purposes of providing analog current and effective calibration. The circuit also includes a P-channel transistor 305 as part of a differential amplifier fabricated within an isolated well. Resistors 310 and 311 are also provided to facilitate calibration.

The present design thus comprises a combined analog and digital calibration circuit for controlling an output offset voltage of a differential amplifier circuit using a back gate control voltage provided to at least one isolated well by providing a digital output offset voltage adjustment to produce an initial output offset voltage and a continuous fine offset voltage adjustment. One embodiment of the design comprises a digitally controlled voltage divider positioned between at least one isolated well and a controllable voltage source, a controllable voltage source controlled by an initial constant current and a variable current, and a controller to modify the variable current to continuously adjust the back gate control voltage. Alternately, the design may include adjusting a control voltage of at least one of a pair of input transistors using a back gate control voltage, providing an analog current to establish a back gate control voltage, and altering the analog current when the back gate control voltage causes an output offset voltage to differ from a reference voltage by more than a predetermined quantity. Altering the analog current changes the back gate control voltage to minimize a difference between output offset voltage and the reference voltage.

The digital voltage divider is comprised of elements 350a, 350b, and so forth represent storage register elements used to control the associated binary weighted switch, shown here as resistors 351a, 351b, and so forth. Switch 302 enables switching to a constant current source.

Figure 4:
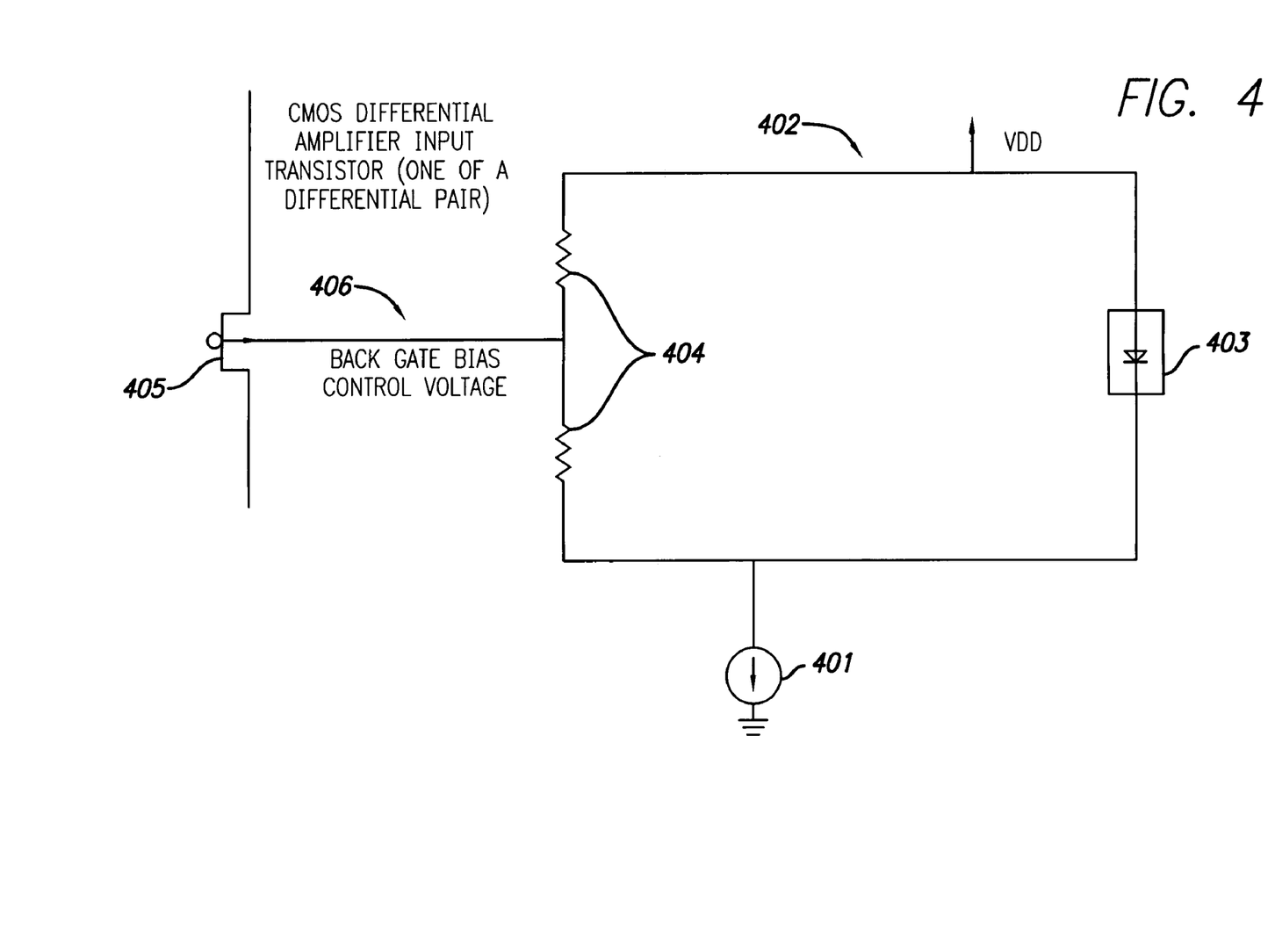
FIG. 4 is a simplified diagram of the present combined analog and digital circuit of the present design.

A simpler representation of the present design is presented in FIG. 4. From FIG. 4, analog current source 401 is connected to circuit 402, which includes diode element 403 and voltage divider 404. Back gate bias voltage is developed along line 406, and CMOS differential amplifier 405 is provided as one of a differential pair. The diode element 403 may be, for example, a PN junction diode, or a BJT (bipolar junction transistor) or MOST (metal oxide semiconductor transistor). In operation, the voltage divider 404 is first set or adjusted to yield a first calibration value with the current source set at a first value. Varying the analog current source causes the voltage drop across the diode element 403 to vary. The back gate control voltage from the voltage divider 404 generally follows the voltage drop across the diode element 403. Thus by controlling the current through the current source 401 can cause changes in the back gate bias control voltage on the differential amplifier 405, such as a CMOS differential amplifier, and can result in changes in the differential amplifier's offset voltage, or calibration value.

The degree of back gate voltage control in the setup of FIG. 4 can be large and comparable to a coarse calibration function as discussed above. Alternately, the control can be relatively small and comparable to the fine calibration function discussed above.

During a setup phase, in the presence of a constant divider current, the circuitry establishes a fixed voltage drop across the diode element 403. A control circuit, not shown, may be employed to perform a digital searching sequence to select a back gate voltage divider ratio and satisfy a calibration setup criteria. For example, if a voltage V is desired, and the back gate voltage is V*2.0, the back gate voltage divider ratio may be 0.5. Variations in the current received from the current source 401 can cause variations in the voltage drop across the diode element 403 that effect the output of the voltage divider 404. The design enables analog control of the current source about the setup value, thereby providing a relative back gate voltage change on the back gate voltage control such that the back gate voltage matches or closely approximates the desired calibration voltage.

MRAM Memory Cell Design—Resistive Cross Point Array

Figure 5:
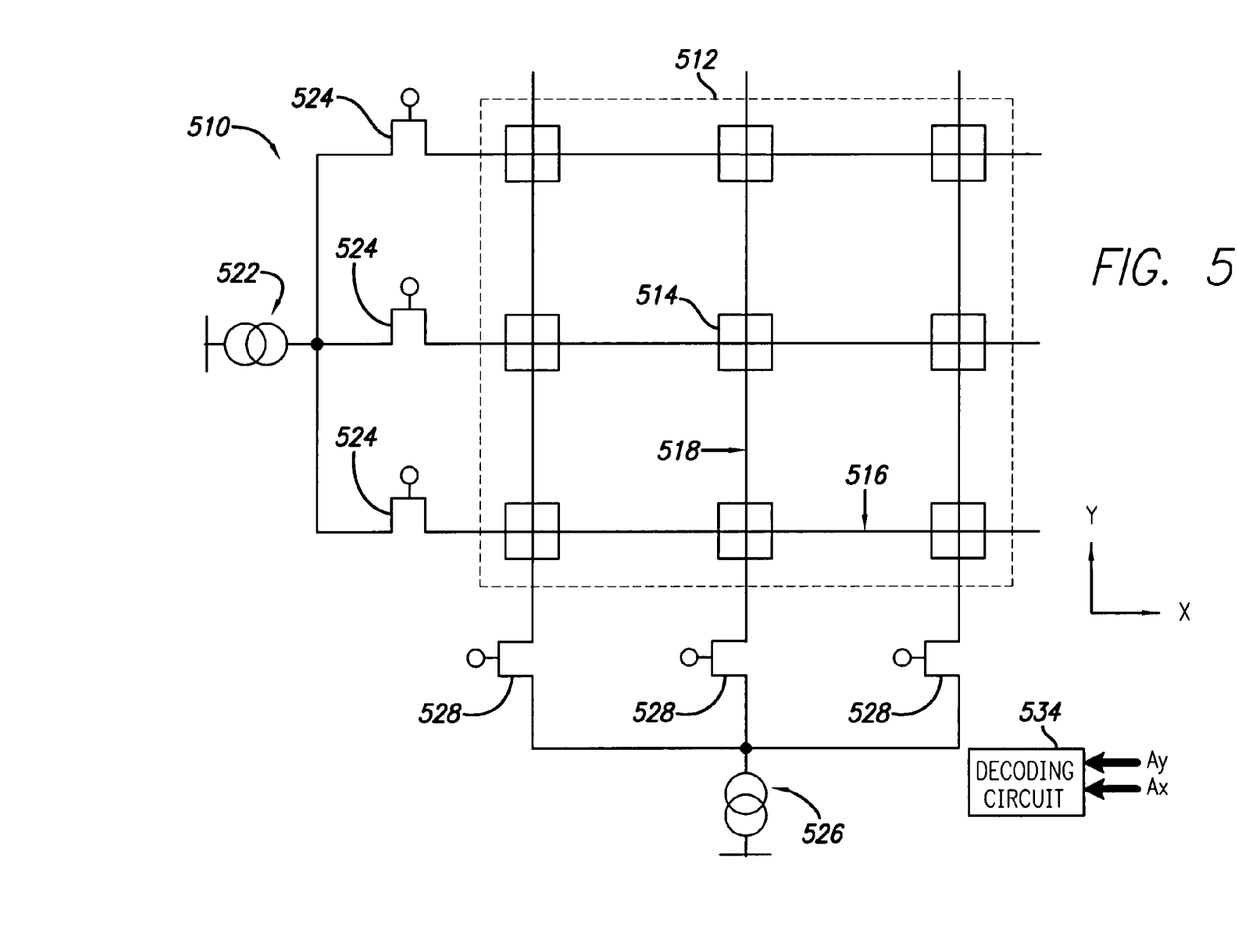
FIG. 5 illustrates a resistive cross point array embodiment with equipotential isolation wherein the present design may be employed.

FIG. 5 illustrates a resistive cross point array embodiment with equipotential isolation, illustrated here as an exemplary embodiment of the present design. FIG. 5 shows an information storage device 510 including a resistive cross point array 512 of memory elements 514. The memory elements 514 are arranged in rows and columns, with the rows extending along an x-direction and the columns extending along a y-direction. Only a relatively small number of memory elements 514 is shown to simplify the illustration of the information storage device 510. In practice, arrays of any size may be used.

Traces functioning as word lines 516 extend along the x-direction in a plane on one side of the memory cell array 512. Traces functioning as bit lines 518 extend along the y-direction in a plane on an adjacent side of the memory cell array 512. One word line 516 may exist for each row of the array 512 and one bit line 518 for each column of the array 512. Each memory element 514 is located at a cross point of a word line 516 and a bit line 518.

The information storage device 510 includes a read circuit for sensing the resistance states of selected memory elements 514 during read operations and a write circuit for supplying write currents to selected word lines 516 and bit lines 518 during write operations. The read circuit is not shown in order to simplify the illustration of the information storage device 510.

The write circuit includes a first current source 522 coupled to the word lines 516 by a first group of transistors 524, a second current source 526 coupled to the bit lines 518 by a second group of transistors 528.

During a write operation, a decoder 534 decodes addresses Ax and Ay to select a word line 516 and a bit line 518. The decoder 534 selects a word line 516 by commanding a transistor 524 of the first group to connect the word line 516 to the first current source 522 and a bit line 518 by commanding a transistor 528 of the second group to connect the bit line 518 to the second current source 526. Currents flow through the selected word and bit lines 516 and 518. The memory element 514 at the crosspoint of the selected word and bit lines 516 and 518 is exposed to the combined magnetic field (Hx+Hy).

FIG. 5 shows a single current source 522 for the word lines 516 and a single current source 526 for the bit lines 518. In large arrays, multiple current sources 522 may be provided for the word lines 516 and multiple current sources 526 may be provided for the bit lines 518, whereby each current source 522 is shared by multiple word lines 516 and each current source 526 is shared by multiple bit lines 518. This allows simultaneous writes to multiple memory elements 514.

Other elements of the write circuit are not shown. For example, FIG. 5 does not show transistors for connecting "free ends" of the word and bit lines 516 and 518 to a reference potential. Moreover, the transistors 524 and 528 and current sources shown in FIG. 5 are a simplification of the write circuit. Circuitry for supplying current to word and bit lines 516 and 518 may be implemented in a variety of different ways.

Application of Present Design to Resistive Cross Point Array

Figure 6:
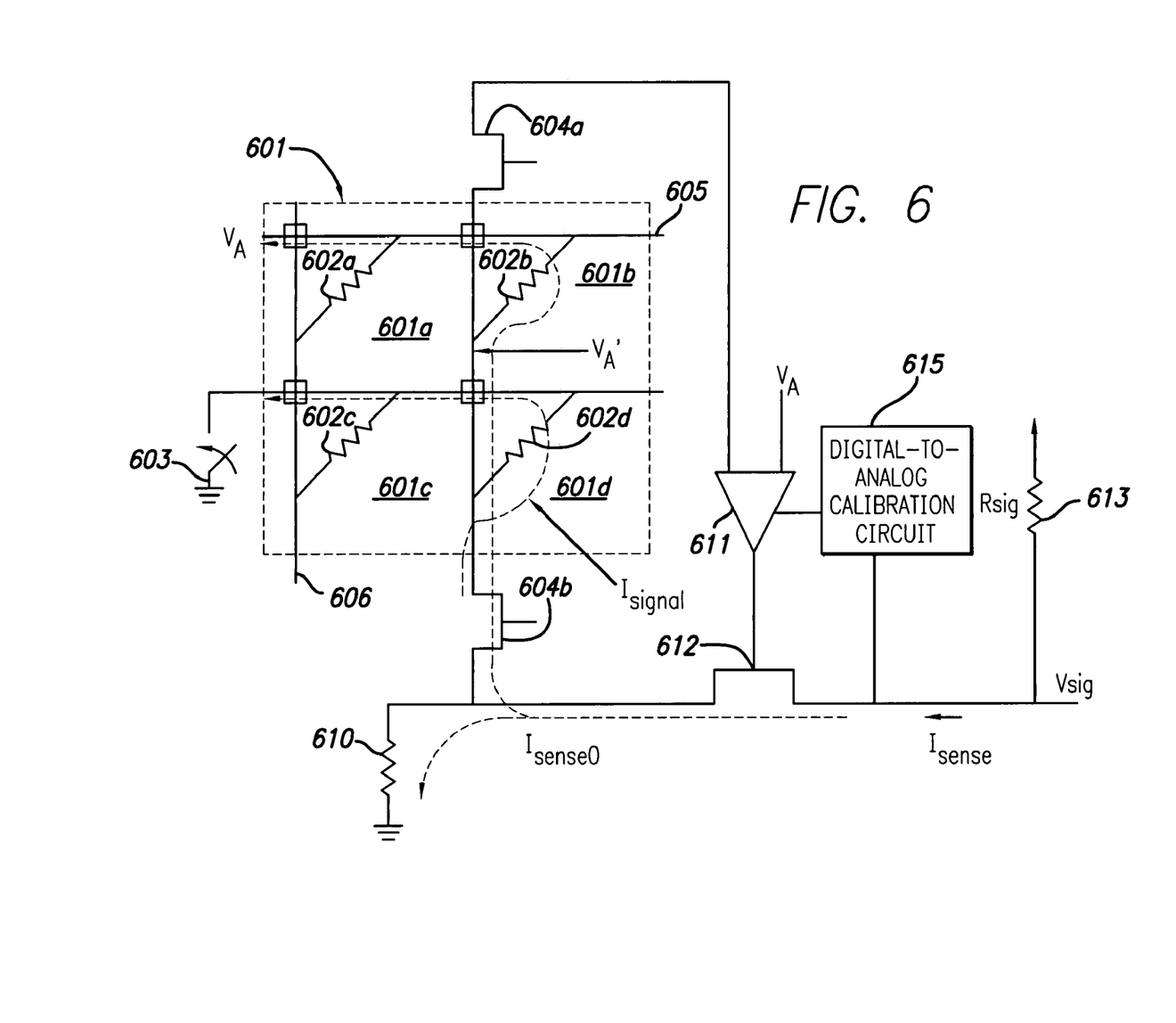
FIG. 6 is an implementation of the present design in association with a resistive cross point array with equipotential isolation.

FIG. 6 illustrates an implementation of the present design. Array 601 comprises, in the view shown, a four element array 601a-d. Resistor 602a in element 601a is a relatively small resistor, while resistors 602b and 602c have resistances Rpar. Resistor 602d has resistance Rsel, representing the selected resistor and array element according to the foregoing description. The applicable Row may be selected, such as by using a switch 603, while the applicable Column is selected using select column switches 604a and 604b. Unselected row 605 and unselected column 606 are not selected in the arrangement shown, but can be selected if desired.

Outside array 601 are load resistor 610, amplifier 611, transistor 612, signal resistor 613, and calibration circuit 615, where calibration circuit 615 is the calibration circuit from, for example, FIG. 3 or 4 described above. As shown, unselected Row 605 exhibits voltage $V_A$, while the selected Column exhibits voltage $V_A'$. Both $V_A$ and $V_A'$ feed into amplifier 611, and amplifier 611 controls $V_A'$ to be equal to $V_A$. As a result, no current flows through element 602(b) in this circuit. Sense current $I_{sense}$ flows through transistor 612. $I_{sense0}$ flows through load resistor 610 and through the unselected rows as shown. $I_{sense}$ is the sum of $I_{sense0}$ and Isense signal. $I_{sense}$ signal flows through the selected row and is equal to $V_A'/R_{Load}$. The calibration phase is defined as sense0. In this phase, row sense switch 603 is open and selected column transistor 604b is asserted. In this Sense0 arrangement, calibration current Ical passing through calibration circuit 615 is adjusted such that Vsig, the voltage at signal resistor 613, is equal to Vref, or the reference voltage, not shown here but represented by approximately VDD/2. In this arrangement, the current Isense0 is:

$$I_{sense0}=(V_A'/R_{Load})+((V_A'-V_A)/R\text{par})=(VDD-V\text{sig})/R\text{sig} \quad (1)$$

Where again Rpar represents the resistance in elements 601b or 601c. The parameters in Equation (1) set the relationship of VDD, Vsig, Rsig, VA, $R_{Load}$, and Rpar. Sense1, the active or sensed phase, has Row switch 603 closed, with the selected row connected to ground, and $$I_{sense1} = I_{sense0} + I_{signal} = I_{sense0} + V_A'/R\text{sel} \quad (2)$$

The values of Equation (2) assume $V_A'$ is constant and does not change. $V_A'$, is controlled by amplifier 611 and the remote sense control loop. If $I_{sense1}$ is greater than $I_{sense0}$, Vsig goes low (0) and thus signifies a programmed selected resistance Rsel, and thus signifies one stored memory state represented by a relatively low value of Rsel. If, on the other hand, $I_{sense1}$ is approximately equal to $I_{sense0}$, Vsig will have little change and thus signifies a second stored state where Rsel is a relatively high resistance. Based on these values, the system can calibrate voltage provided to the array 601.

Figure 7:
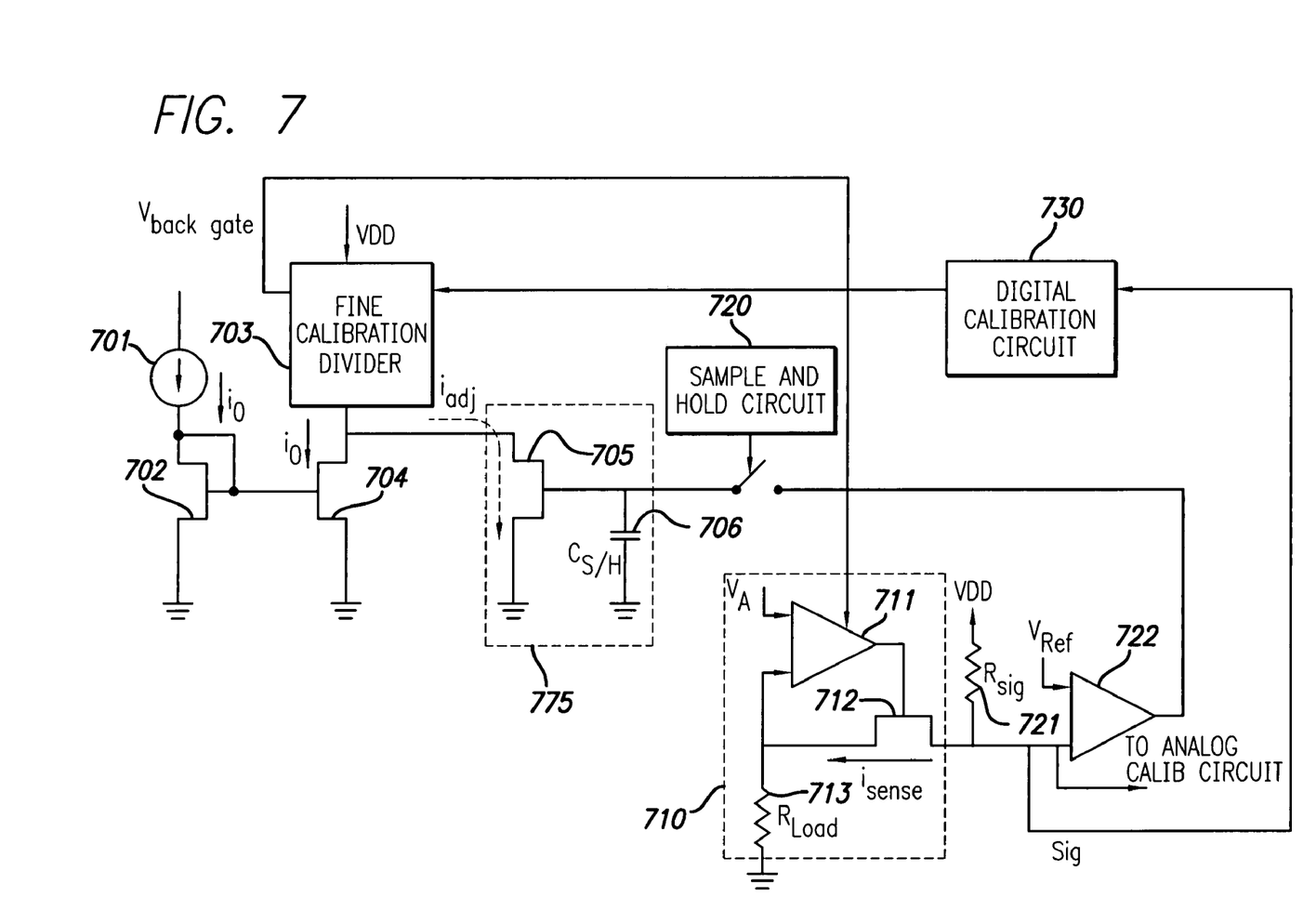
FIG. 7 shows an adaptive analog source used to control a fine calibration circuit.

FIG. 7 shows an adaptive analog source used to control a fine calibration circuit. Current source 701 provides initial calibration current $i_0$ to the mirror master transistor. Transistor 702 and 704 form a current mirror providing a constant calibration current $i_0$. Fine calibration divider 703 receives voltage VDD and produces a back gate voltage $V_{back\_gate}$. Transistor 704 provides the constant current to fine calibration divider 703 and ground. Transistor 705 receives an adjusted current $i_{adj}$, where transistor 705 and sample and hold capacitor 706 establish variable current source 775.

MRAM element 710 represents an equipotential sense amplifier and comprises amplifier 711, transistor 712, and load resistor 713. Amplifier 711 receives back gate voltage and sense current $i_{sense}$ is provided to the transistor 712. Sample and hold circuit 720 has calibration adjusted control. Resistor 721 provides a link from MRAM element 710 to VDD, and amplifier 722 receives a reference voltage, Vref. A signal is pulled off of the line from MRAM element 710 and provided to digital calibration circuit 730, used to operate the fine calibration divider 703. The result of the circuit of FIG. 7 is an adaptation of each sense cycle using a variable current source, where the sample and hold function is based on feedback from the voltage signal pulled from the line coming from MRAM element 710.

Figure 8:
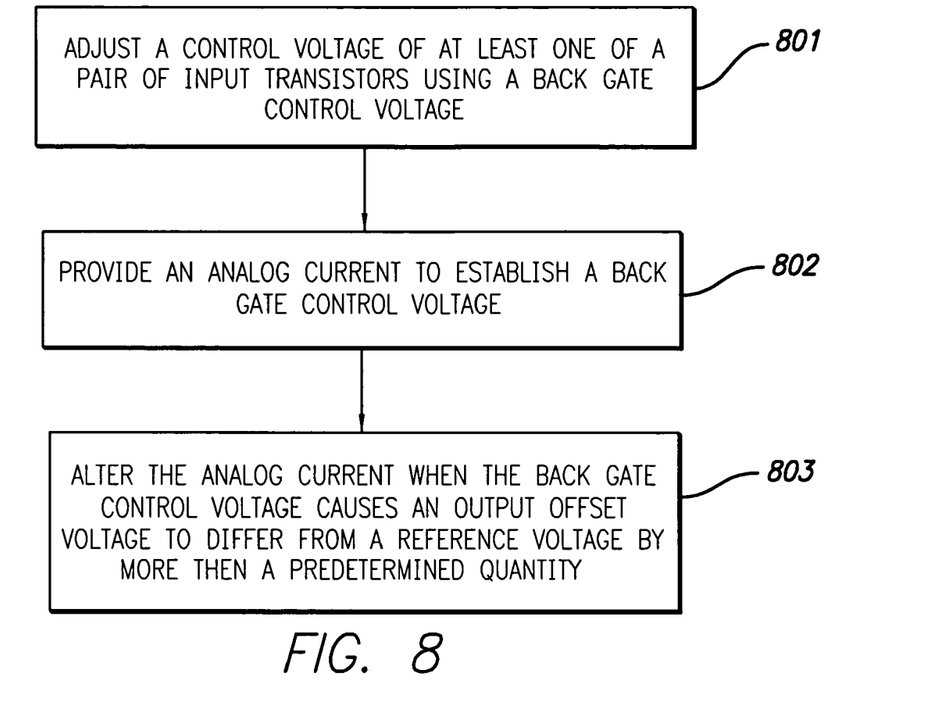
FIG. 8 is a flowchart of one embodiment of a method according to the present design.

FIG. 8 illustrates the general operation of the present design, namely adjusting an output offset voltage of a differential amplifier circuit. From FIG. 8, element 801 calls for adjusting a control voltage of at least one of a pair of input transistors using a back gate control voltage. Element 802 provides an analog current to establish a back gate control voltage, while element 803 alters the analog current when the back gate control voltage causes an output offset voltage to differ from a reference voltage by more than a predetermined quantity. In this arrangement, altering the analog current changes the back gate control voltage to minimize difference between output offset voltage and the reference voltage.

Figure 9:
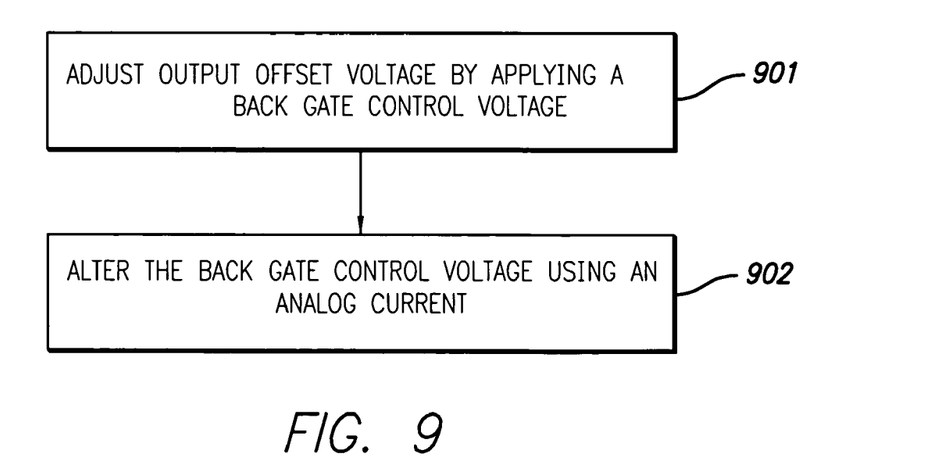
FIG. 9 illustrates an alternate embodiment of a method according to the present design.

FIG. 9 illustrates alternate operational embodiment of the present design. From FIG. 9, element 901 adjusts output offset voltage by applying a back gate control voltage, and element 902 alters the back gate control voltage using an analog current. In this aspect, altering the analog current changes the back gate control voltage to minimize a difference between the offset voltage and the reference voltage While the aforementioned and illustrated devices and methods for combined digital and analog calibration circuitry for use in advanced applications, such as MRAM applications, has been described in connection with exemplary embodiments, those skilled in the art will understand that many modifications in light of these teachings are possible, and this application is intended to cover any variation thereof. Accordingly, any and all modifications, variations, or equivalent arrangements which may occur to those skilled in the art, should be considered to be within the scope of the present invention as defined in the appended claims.

What is claimed is:

1. A combined analog and digital calibration circuit for controlling an output offset voltage of a differential amplifier circuit using a back gate control voltage provided to at least one isolated well comprising:
   a digitally controlled voltage divider positioned between at least one isolated well and a controllable voltage source;
   a controllable voltage source controlled by an initial constant current and a variable current; and
   a controller to modify the variable current to continuously adjust the back gate control voltage.

2. The combined analog and digital calibration circuit of claim 1, wherein the digitally controlled resistor divider causes the back gate control voltage to initially set a first output offset voltage, and varying the analog current provided by the current source alters the back gate control voltage and the output offset voltage.

3. The combined analog and digital calibration circuit of claim 1, wherein the analog current source is controlled to maintain the offset voltage within a predetermined threshold.

4. The combined analog and digital calibration circuit of claim 1, further comprising a voltage control element operationally connected to the voltage divider circuit, wherein varying the current provided by the current source alters voltage across the voltage divider and voltage across the voltage control element.

5. The combined analog and digital calibration circuit of claim 1, wherein the differential amplifier circuit comprises a CMOS differential amplifier.

6. The combined analog and digital calibration circuit of claim 1, further comprising controlling the analog current provided by the analog current source by monitoring at least one environmental parameter and adjusting the analog current based on the at least one environmental parameter.

7. The combined analog and digital calibration circuit of claim 1, wherein the voltage divider circuit comprises a digital voltage divider circuit comprising a plurality of transistors.

8. The combined analog and digital calibration circuit of claim 4, wherein the voltage control element comprises one from a group comprising a resistor, a PN junction diode, a bipolar junction transistor, and a metal oxide semiconductor transistor.

9. A method for adjusting an output offset voltage of a differential amplifier circuit, comprising:
   adjusting a control voltage of at least one of a pair of input transistors using a back gate control voltage;
   providing an analog current to establish a back gate control voltage; and
   altering the analog current when the back gate control voltage causes an output offset voltage to differ from a reference voltage by more than a predetermined quantity;
   wherein altering the analog current changes the back gate control voltage to minimize a difference between output offset voltage and the reference voltage.

10. The method of claim 9, wherein altering the analog current to minimize offset comprises employing a voltage control element and a voltage divider, and altering the analog current changes voltage control element voltage and voltage divider voltage.

11. The method of claim 10, wherein the voltage control element comprises one from a group comprising a resistor, a PN junction diode, a bipolar junction transistor, and a metal oxide semiconductor transistor.

12. The method of claim 9, wherein back gate control voltage is provided to at least one isolated well.

13. The method of claim 10, wherein providing the analog current establishes an initial voltage control element voltage, an initial voltage divider voltage, an initial back gate control voltage, and an initial offset, and altering the analog current reduces initial offset by altering the initial voltage control element voltage, the initial voltage divider voltage, and the initial back gate control voltage.

14. The method of claim 9, wherein the amplifier circuit comprises a CMOS differential amplifier.

15. The method of claim 9, further comprising controlling the analog current provided by the analog current source by monitoring at least one environmental parameter and adjusting the analog current based on the at least one environmental parameter.

16. A method for adjusting an output offset voltage of a differential amplifier circuit, comprising:
   initially adjusting output offset voltage by applying a back gate control voltage through a digitally controlled voltage divider; and
   altering the back gate control voltage using an analog current;
   wherein altering the analog current changes the back gate control voltage to minimize a difference between the offset voltage and the reference voltage.

17. The method of claim 16, wherein altering the analog current to minimize offset comprises employing a voltage control element and a voltage divider, and altering the analog current changes voltage control element voltage and voltage divider voltage.

18. The method of claim 17, wherein the voltage control element comprises one from a group comprising a resistor, a PN junction diode, a bipolar junction transistor, and a metal oxide semiconductor transistor.

19. The method of claim 16, wherein back gate control voltage is provided to at least one isolated well.

20. The method of claim 17, wherein providing the analog current establishes an initial voltage control element voltage, an initial voltage divider voltage, an initial back gate control voltage, and an initial offset, and altering the analog current reduces initial offset by altering the initial voltage control element voltage, the initial voltage divider voltage, and the initial back gate control voltage.

21. The method of claim 17, wherein the amplifier circuit comprises a CMOS differential amplifier.

* * * * *